United States Patent [19]

Miyahara

[11] Patent Number: 5,745,594
[45] Date of Patent: Apr. 28, 1998

[54] APPARATUS FOR TESTING A BONDING POSITION OF A BONDING WIRE

[75] Inventor: Yuichi Miyahara, Kawasaki, Japan

[73] Assignee: Kabushiki Kaisha Toshiba, Kawasaki, Japan

[21] Appl. No.: 538,648

[22] Filed: Oct. 4, 1995

Related U.S. Application Data

[63] Continuation of Ser. No. 159,310, Nov. 30, 1993, abandoned.

[30] Foreign Application Priority Data

Dec. 28, 1992 [JP] Japan .................................. 4-361243

[51] Int. Cl.$^6$ .................................................. G06J 5/30
[52] U.S. Cl. ........................ 382/150; 382/205; 382/257
[58] Field of Search ................................ 382/150, 151, 382/147, 205, 257, 258, 302, 308; 348/126, 87, 92

[56] References Cited

U.S. PATENT DOCUMENTS

| | | | |
|---|---|---|---|
| 4,972,493 | 11/1990 | Chemaly | 382/308 |
| 4,975,972 | 12/1990 | Bose et al. | 382/149 |
| 5,161,202 | 11/1992 | Kitakado et al. | 382/147 |
| 5,170,062 | 12/1992 | Miyahara | 348/126 |
| 5,214,712 | 5/1993 | Yamamoto | 382/149 |
| 5,225,891 | 7/1993 | Choumei | 348/126 |
| 5,298,989 | 3/1994 | Tsukahara et al. | 348/126 |

OTHER PUBLICATIONS

Tsukahara et al. "Automated Visual Inspection System for Bonded IC Wires." Fujitsu Sci Tech J. vol. 28, No. 1, Spring 1992, pp. 107–114.

Baxes, *Digital Image Processing; Principles and Applications*, John Wiley & Sons, Inc., 1994, pp. 129–137.

Low, "Introductory Computer Vision and Image Processing." McGraw-Hill Book Company, 1991, pp. 100–108.

*Primary Examiner*—Michael T. Razavi
*Assistant Examiner*—Jon Chang
*Attorney, Agent, or Firm*—Finnegan, Henderson, Farabow, Garrett & Dunner, L.L.P.

[57] ABSTRACT

An imaging device for imaging an object is situated above the object. A downward-illumination device for emitting light to the object is situated as one unit with the imaging device. A background-illumination device for emitting light to the object is situated below the object. An image obtained by the imaging device is stored in a memory unit of an image processing apparatus. The image processing apparatus includes a processing unit for logically processing the image. The illumination devices are connected to power supplies. The image processing apparatus and the power supplies are controlled by a controller. Thus, a bonding position is recognized easily with simple structure, the reliability of test results is enhanced, and the cost for testing is reduced by a decrease in the processing time.

9 Claims, 9 Drawing Sheets

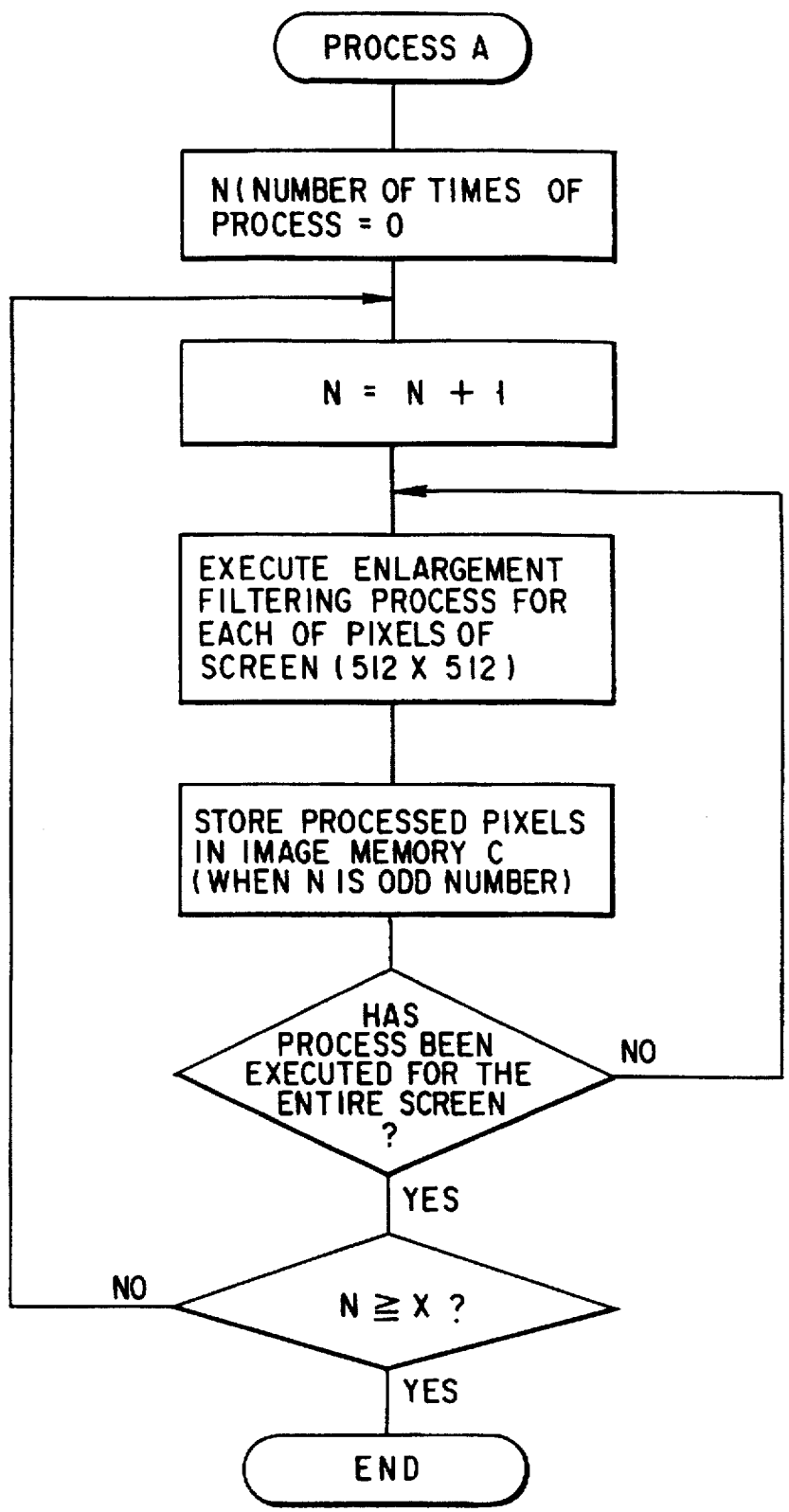
F I G. 8

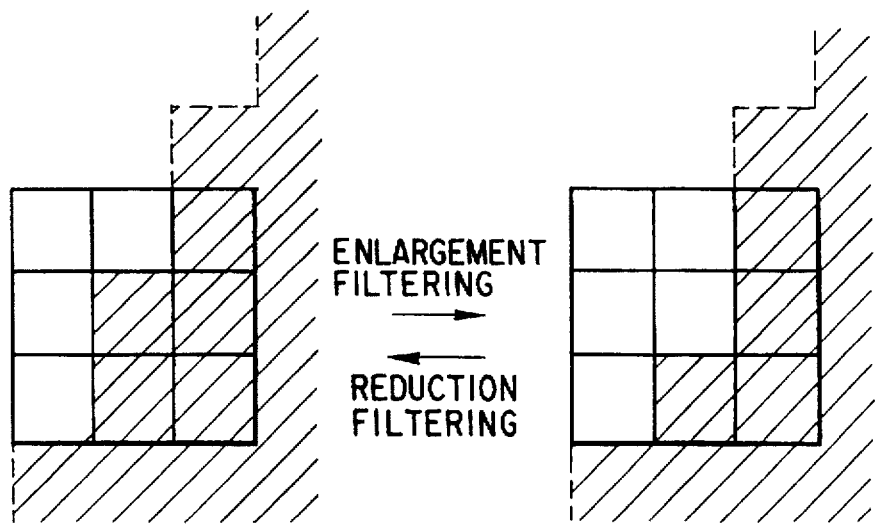
F I G. 13A
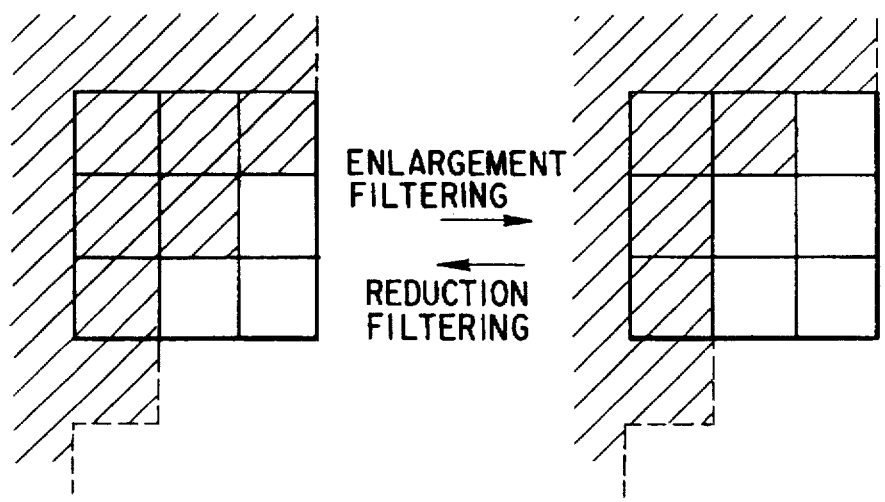
F I G. 13B

APPARATUS FOR TESTING A BONDING POSITION OF A BONDING WIRE

This application is a continuation of application Ser. No. 08/159,310 filed Nov. 30, 1993 now abandoned.

BACKGROUND OF THE INVENTION

1. Field of the Invention

The present invention relates to an apparatus for testing a position of a bonding wire bonded onto an inner lead.

2. Description of the Related Art

Conventionally, in the field of semiconductor technology, a test for wires after wire bonding is mainly carried out by a human visual inspection using a microscope, etc. In particular, at present, the bonding position of bonding wires on an inner lead is recognized by the human visual sense.

Recently, the technology relating to automated wire test has developed, and, for example, methods using image processing technique, as shown in FIGS. 1A, 1B and 3, has been developed.

According to the method shown in FIGS. 1A and 1B, an image of a round object alone such as bonding wire is obtained (a white image is obtained). Specifically, an imaging device 1 is situated vertically above an object 2 to be imaged, and an illumination device 3 is situated horizontally with respect to the object 2. When light is emitted from the illumination device 3 to the object 2, part of the light reaches a round object 2a on the object 2 and is reflected towards the imaging device 1. Thus, the object 2a is recognized. Accordingly, if the object is supposed to include an inner lead and a bonding wire bonded on the inner lead, the imaging device 1 produces an image as shown in FIG. 2A.

According to the method of FIG. 3, an image of a plate-like member alone such as an inner lead is obtained (i.e. a white image is obtained). Specifically, both the imaging device 1 and illumination device 3 are situated vertically above the object 2. When light is emitted from the illumination device 3 to the object 2, the light reaches a plate-like member 2b of the object 2 and is reflected towards the imaging device 1. Thus, the object 2b is recognized. Accordingly, if the object is supposed to include an inner lead and a bonding wire bonded on the inner lead, the imaging device 1 produces an image as shown in FIG. 2B.

However, in the methods of FIGS. 1A and 1B, the bonding wire 4 is shown as a white image, as in FIG. 2A. However, a wire collapse portion 6 on the inner lead 5 has a complex shape, and therefore an unstable image thereof is obtained due to the direction of light or a variation in light intensity. Since the wire collapse portion 6 is not monitored as a clear white image, the test reliability lowers if no countermeasure is taken.

According to the method of FIG. 3, as shown in FIG. 2B, the inner lead 5 is monitored as a white image, but other part (including the bonding wire 4) is monitored as a black image. In other words, according to this method, the wire collapse portion 6 can be recognized, but the bonding wire 4 and the background 7 are not clearly distinguishable. A process for extracting only the wire collapse portion 6 is not cost-effective and is difficult. In addition, a considerable deal of time is needed for this process, and the test cost may increase.

As has been described above, the conventional methods for recognizing the bonding position of bonding wire on the inner lead by using image processing technique have drawbacks: a decrease in reliability of test result and an increase in test cost due to an increase in processing time.

SUMMARY OF THE INVENTION

The present invention has been made to solve the above problems, and its object is to provide a technique for recognizing a bonding position easily with simple structure, whereby the reliability of test results is enhanced, and the cost for testing is reduced by a decrease in the processing time.

In order to achieve the above object, there is provided an apparatus for testing a bonding position of a bonding wire, comprising: imaging means, situated above an object, for imaging the object; first illumination means, situated above the object, for emitting light to the object; second illumination means, situated below the object, for emitting light to the object; image processing means including a memory unit for storing an image obtained by the imaging means and a processing unit for logically processing the image; first power supply means for supplying power to turn on/off the first illumination means; second power supply means for supplying power to turn on/off the second illumination means; and control means for controlling the operations of the image processing means, the first power supply means and the second power supply means.

The object includes a member to be bonded and a bonding wire bonded to the member to be bonded, and the control means comprises: data input means for presetting a number of times (X) of a logical process; means for obtaining a first image consisting of an image portion of the member to be bonded, which image portion has a first brightness, and the other image portion having a second brightness, by turning on the first power supply means and imaging the object by means of the imaging means; means for obtaining a second image consisting of an image portion of the member to be bonded and the bonding wire, which image portion has the second brightness, and the other image portion having the first brightness, by turning on the second power supply means and imaging the object by means of the imaging means; means for obtaining a third image including an image portion of the member to be bonded, which image portion alone has the second brightness, by subjecting the second image to a logical process a number of times (X), through which logical process a center pixel of 3×3 pixels is made to have the first brightness if the eight pixels surrounding the center pixel include one with the first brightness; means for obtaining a fourth image by subjecting the third image to a logical process a number of times (X), through which logical process the center pixel of the 3×3 pixels is made to have the second brightness if the eight pixels surrounding the center pixel include one with the second brightness; means for obtaining a fifth image including an image portion of the bonding wire on the member to be bonded, which image portion alone has the first brightness, by subjecting the first image and the fourth image to one of a NOR process and a NAND process; means for obtaining a sixth image including an image portion of a wire collapse portion of the bonding wire, which image portion alone has the first brightness, by subjecting the fifth image to a logical process a number of times (X), through which logical process the center pixel of the 3×3 pixels is made to have the second brightness if the eight pixels surrounding the center pixel include one with the second brightness; and means for obtaining a seventh image by subjecting the sixth image to a logical process a number of times (X), through which logical process the center pixel of the 3×3 pixels is made to have the first brightness if the eight pixels surrounding the center pixel include one with the first brightness.

The number of times (X) of the logical process, which is preset by the data input means, is determined such that the associated logical process is executed the number of times (X) whereby the brightness of the image of at least the bonding wire being present outside the member to be bonded changes from the second brightness to the first brightness and the third image is obtained, and whereby the brightness of the image of at least the bonding wire excluding the wire collapse portion changes from the first brightness to the second brightness and the sixth image is obtained.

The image processing apparatus is a two-value image processing apparatus having only two values of "light" (white) and "dark" (black), the first brightness is "light", the second brightness is "black", and the first image and the fourth image are converted to the fifth image by the NOR process.

The image processing apparatus is a two-value image processing apparatus having only two values of "light" (white) and "dark" (black), the first brightness is "dark", the second brightness is "white", and the first image and the fourth image are converted to the fifth image by the NAND process.

According to the above structure, in testing a bonding position on an object including a bonding wire bonded on a member to be bonded, the object is imaged by two different imaging methods, and the objected images are processed by predetermined image processing means. Thus, the bonding position of the bonding wire on an inner lead, i.e. a wire collapse portion, is recognized.

Thereby, exact measurement with clear images can be performed, the test accuracy is enhanced, and the image processing time is reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 8 is a flow chart illustrating a process A (enlargement filtering process) illustrated in FIGS. 6 and 7;

FIG. 13A and FIG. 13B show specifically the enlargement/reduction filtering process.

DETAILED DESCRIPTION OF THE PREFERRED EMBODIMENTS

A test apparatus for testing the bonding position of a bonding wire according to the present invention will now be described with reference to the accompanying drawings.

Figure 4:
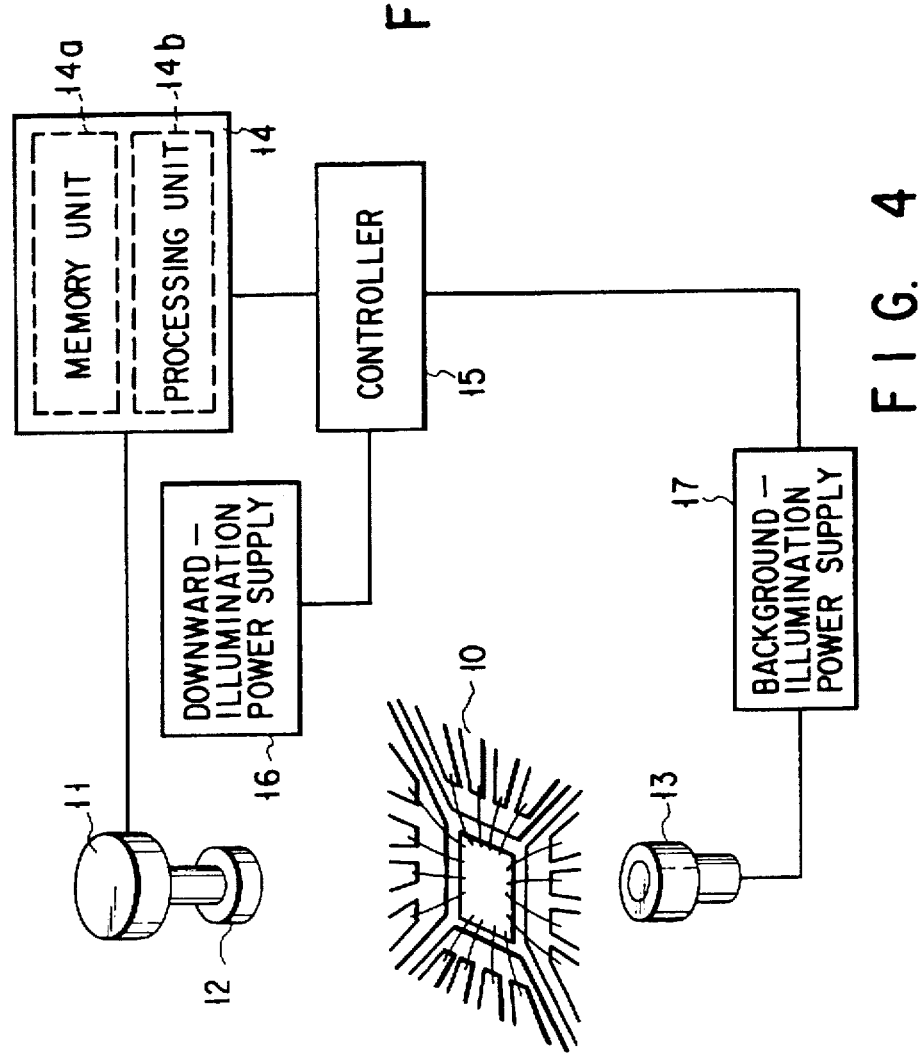
FIG. 4 is a block diagram showing the structure of a test apparatus for testing the bonding position of a bonding wire according to an embodiment of the present invention.
Figure 6:
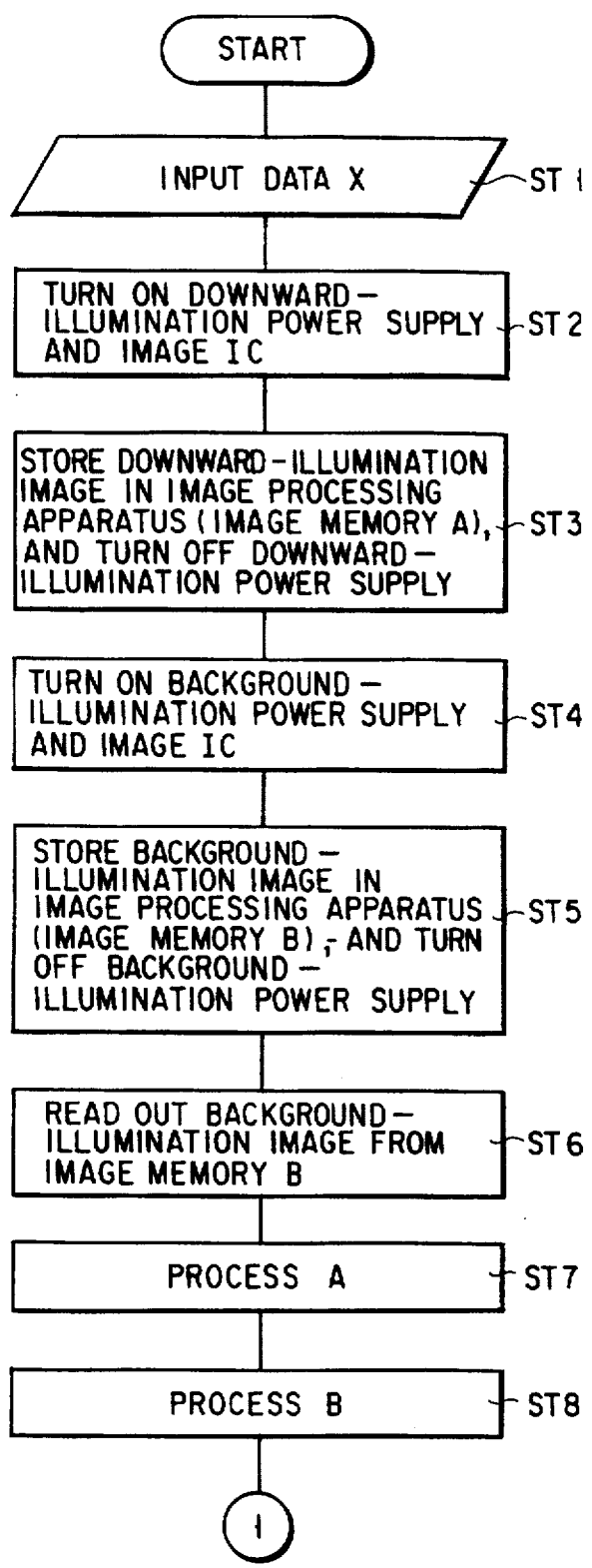
FIGS. 6 and 7 are flow charts illustrating an operation of a controller (or an image processing method) of the present invention.
Figure 7:
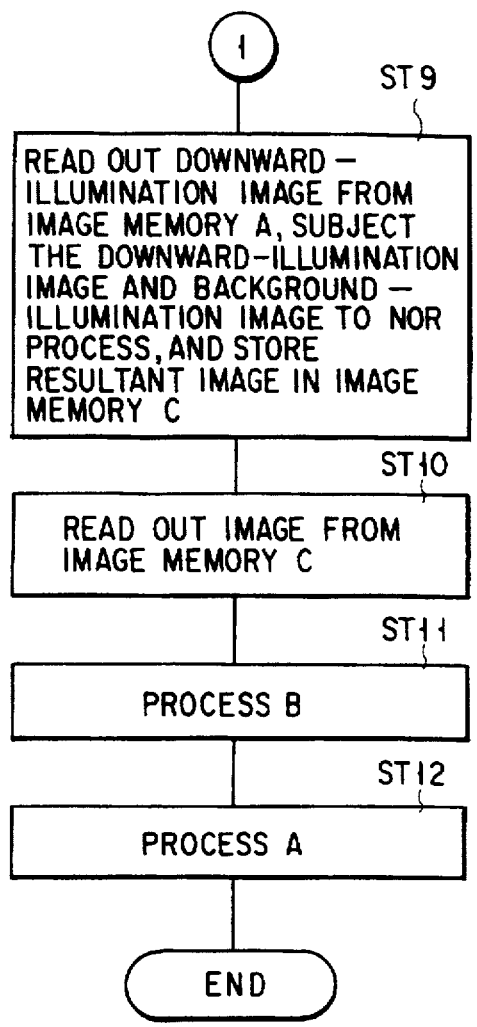
Figure 9:
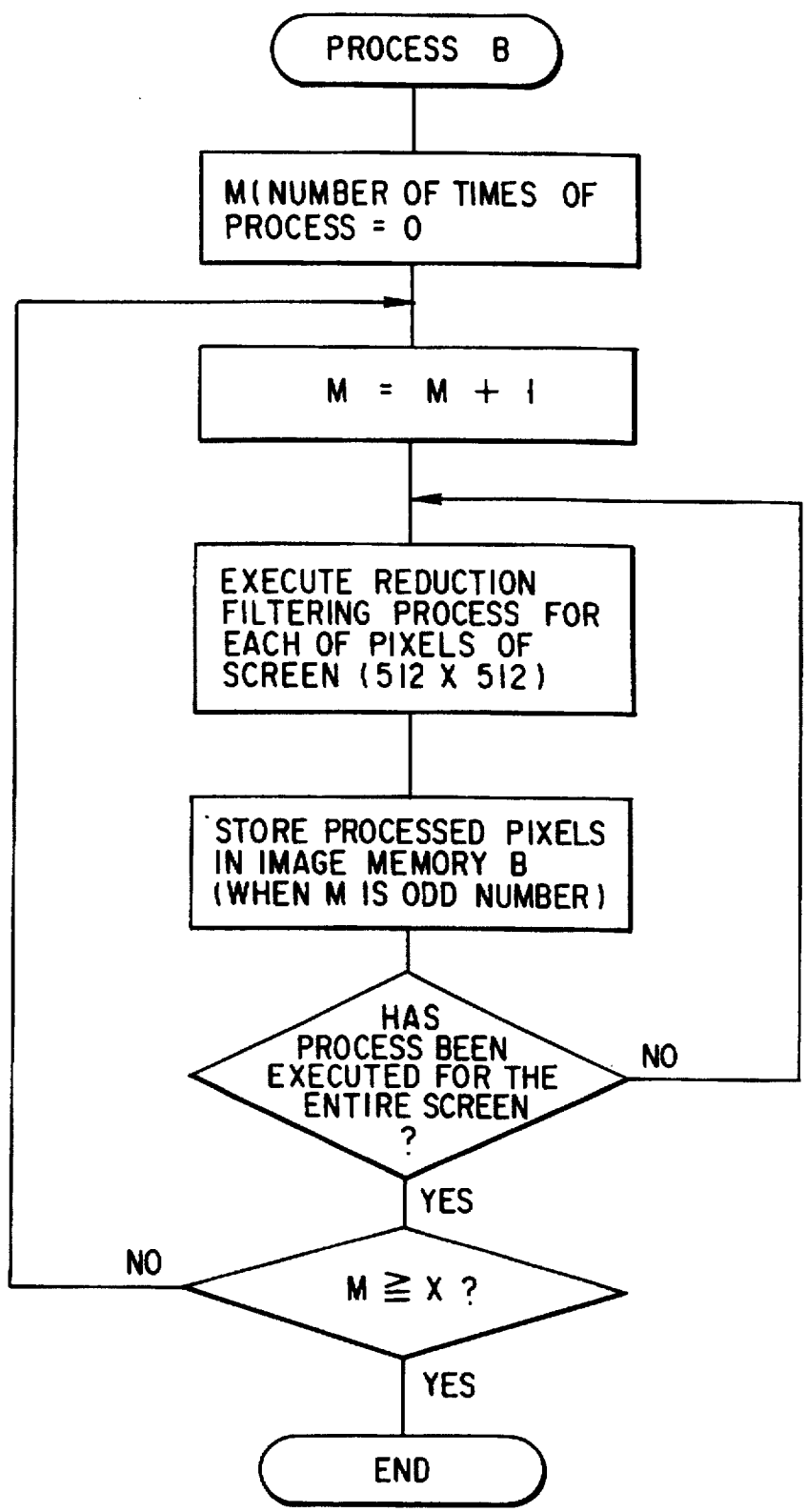
FIG. 9 is a flow chart illustrating a process B (reduction filtering process) illustrated in FIGS. 6 and 7.

FIG. 4 shows a test apparatus for testing the bonding position of a bonding wire according to an embodiment of the present invention.

Figure 2A:
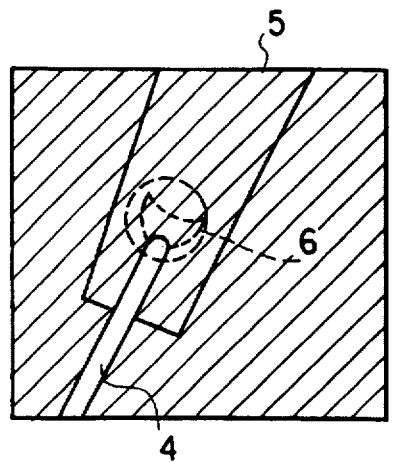
FIG. 2A and FIG. 2B show images of objects obtained by conventional imaging methods.
Figure 2B:
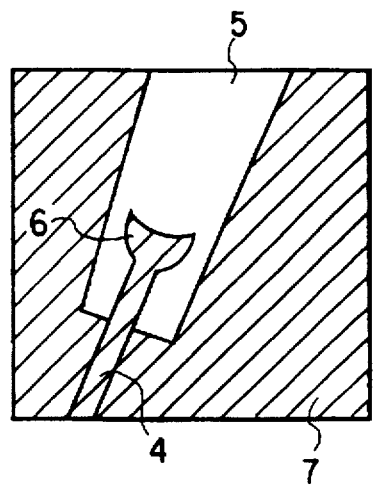
Figure 3:
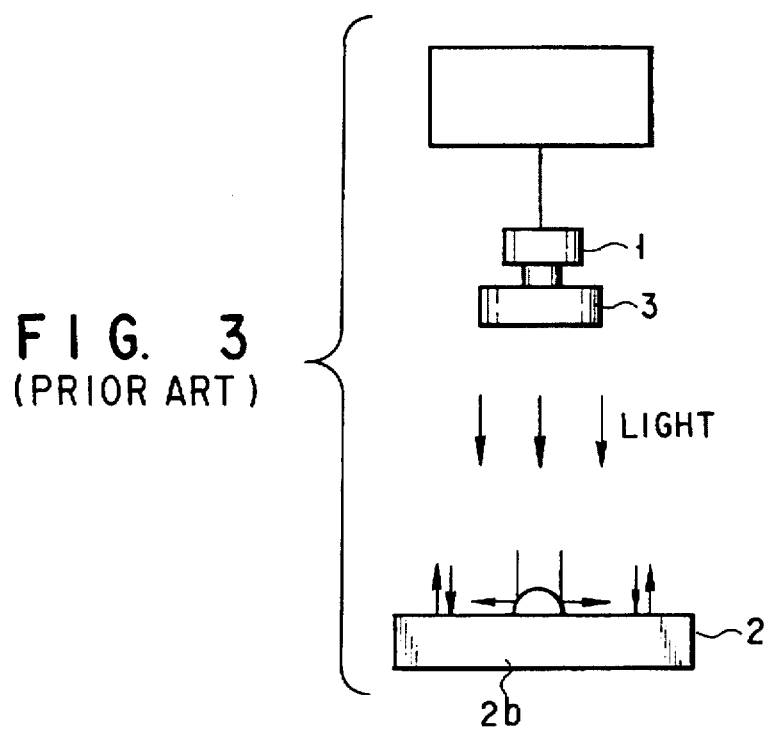
FIG. 3 illustrates a concept of a conventional object-imaging method.

In FIG. 4, an IC (object) 10 obtained after wire bonding is situated at a test position. An imaging device 11 is situated vertically above the IC 10. In addition, a downward-illumination device 12 is situated vertically above the IC 10. The imaging device 11 is attached to the downward-illumination device 12. The image of FIG. 2B mentioned in the description of the prior art is obtained by the imaging device 11 and downward-illumination device 12.

Figure 5:
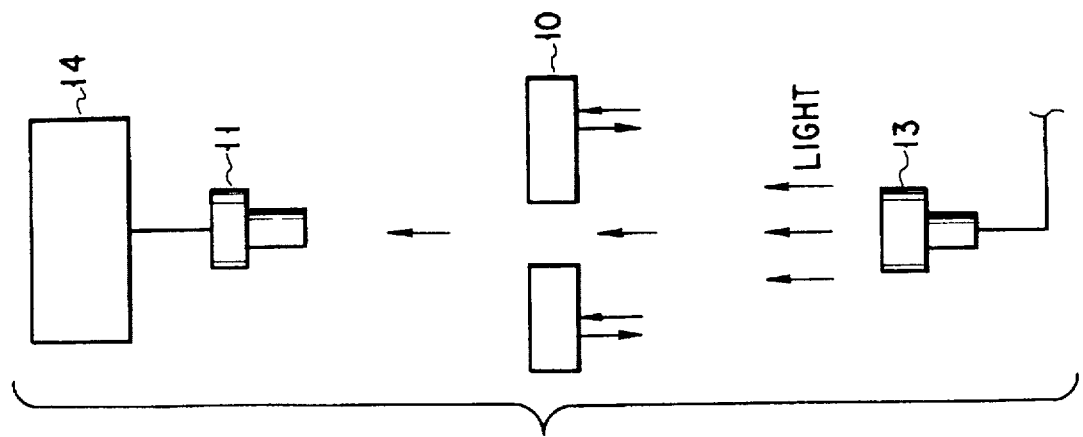
FIG. 5 illustrates a concept of a method for obtaining a background-illumination image employed in the present invention.

A background-illumination device 13 is situated vertically below the IC 10. The background-illumination device 13 emits light upwards to the bottom of the IC 10. Since the IC 10 or the object interrupts the light path, as shown in FIG. 5, an image showing the IC portion in silhouette (black) is obtained.

The imaging apparatus 11 is connected to an image processing apparatus 14. The image processing apparatus 14 includes a memory unit (image memory) 14a for storing an image signal of an image (a downward-illumination image) of the IC 10 obtained by the light from the downward-illumination device 12, and an image signal of an image (a background-illumination image) of the IC 10 obtained by the light from the background-illumination device 13. The image processing apparatus 14 also includes a processing unit 14b for executing a process (described later) in response to a command from a controller 15 connected to the image processing apparatus 14. Thus, the image processing apparatus 14 tests the bonding position of bonding wire on the inner lead.

The downward-illumination device 12 is connected to a downward-illumination power supply 16, and the background-illumination device 13 is connected to a background-illumination power supply 17. Both the downward-illumination power supply 16 and background-illumination power supply 17 are connected to the controller 15 and are automatically turned on/off by a command from the controller 15. Accordingly, the downward-illumination device 12 and background-illumination device 13 are turned on/off.

Figure 10:
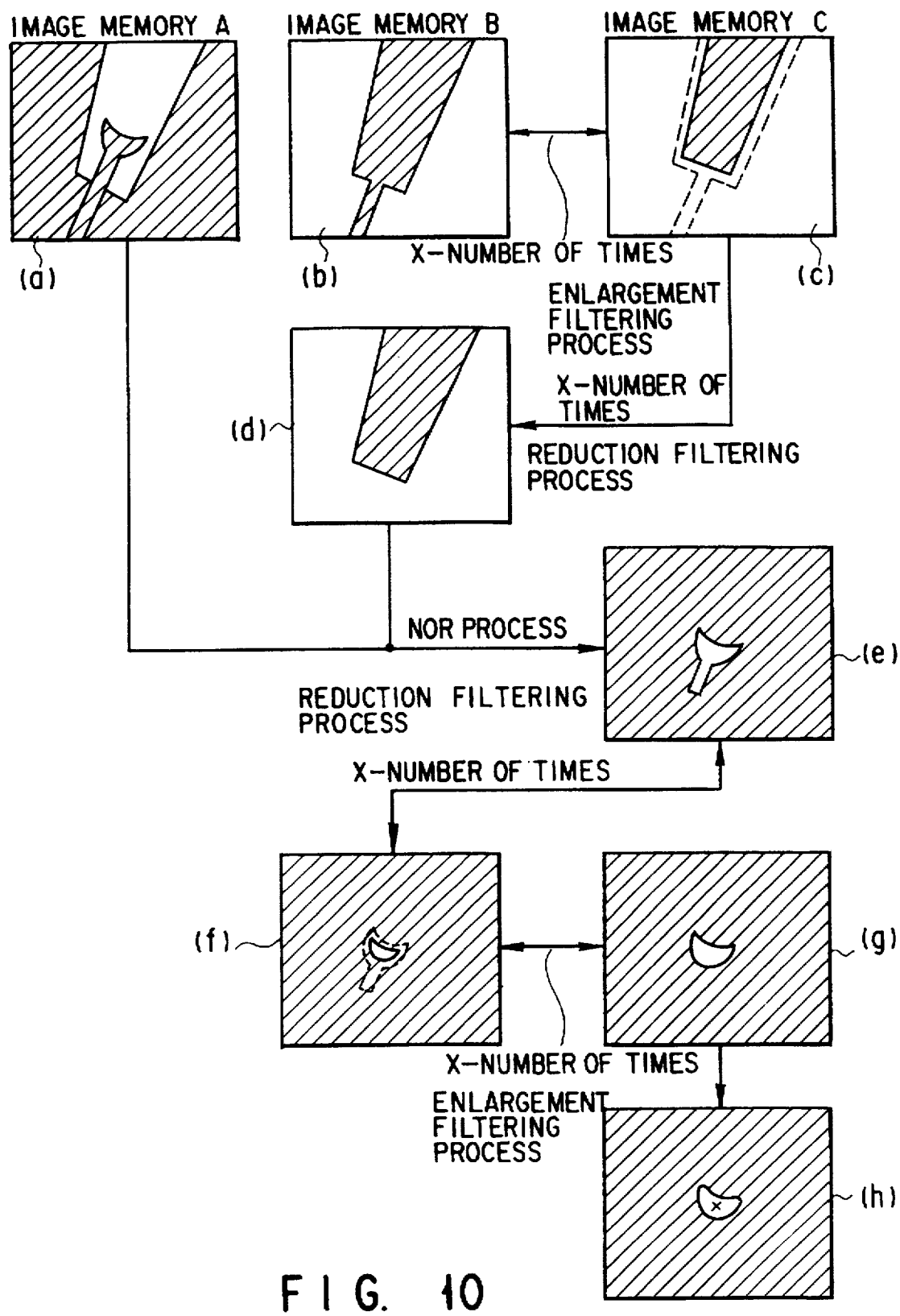
FIG. 10 shows the states of images in image memories A, B and C of the image processing apparatus.

Next, a method (an image processing procedure) of recognizing the bonding position of the bonding wire on the inner lead by using the image obtained by the imaging apparatus 11 will now be described in detail with reference to FIGS. 6 to 10. FIGS. 6 to 9 are flow charts illustrating the operation of the test apparatus according to the present invention and FIG. 10 shows images stored in image memories A to C within the image processing apparatus 14.

A number of times X (an optimal value is predetermined: e.g. X=5) of a logical filtering process (described later) is input (step ST1).

The downward-illumination power supply 14 is turned on, and light is emitted downward to the top of the IC (object). At the same time, the IC is imaged by the imaging device 11, and the obtained image (downward-illumination image) is stored in an image memory A within the image processing apparatus 14. As is shown in FIG. 10(a), the image stored in the image memory A includes a white image portion of the flat inner lead. Then, the downward-illumination power supply 14 is turned off (steps ST2 and ST3).

Subsequently, the background-illumination power supply 15 is turned on, and light is emitted upward to the bottom of the IC (object). At the same time, the IC is imaged by the imaging device 11, and the obtained image (background-illumination image) is stored in an image memory B within the image processing apparatus 14. As is shown in FIG. 10(b), the image stored in the image memory B shows the object in silhouette, i.e. showing the inner lead and bonding wire in black and the other area in white. Thereafter, the background-illumination power supply 14 is turned off (steps ST4 and ST5).

Next, the background-illumination image is taken out from the image memory B, and a logical filtering process is executed (steps ST6 and ST7). In the present invention, the logical filtering process comprises a reduction filtering process and an enlargement filtering process. The principles of these processes will now be described at first.

Figure 11A:
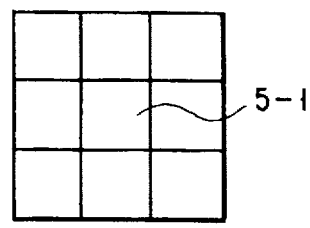
FIGS. 11A to 11C illustrate a logical filtering process.

In the logical filtering process, the brightness of a center pixel 5-1 of 3×3 pixels, as shown in FIG. 11A, is determined on the basis of the brightnesses of the surrounding pixels (8 pixels) (in this embodiment, it is presupposed that a two-value image is employed and therefore there are only two levels of brightness: light (white) and dark (black)).

Figure 11B:
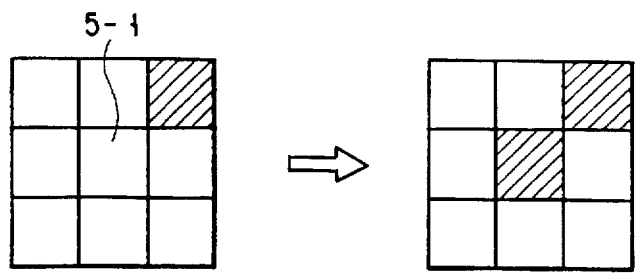
Figure 11C:
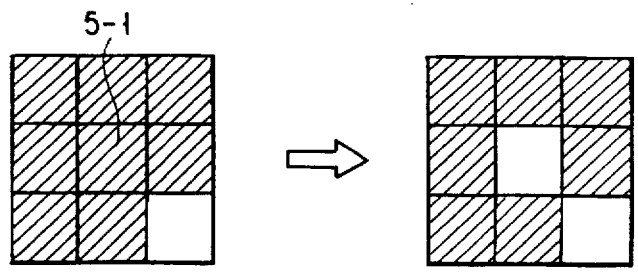

In the reduction filtering process, as shown in FIG. 11B, if even one black pixel is included in the 8 pixels surrounding the center pixel 5-1, the center pixel 5-1 is blackened. In other words, only when all 8 pixels are white, will the center pixel 5-1 be whitened.

Figure 1A:
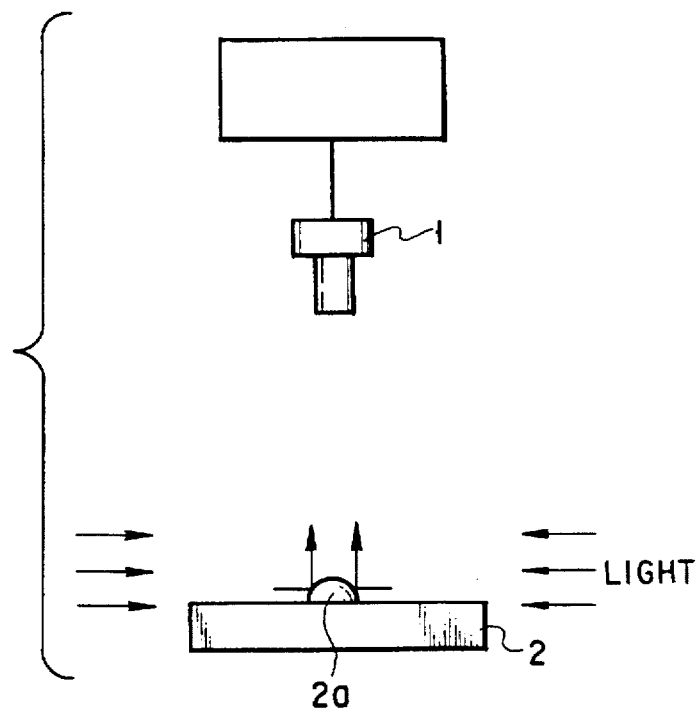
FIG. 1A and FIG. 1B illustrate a concept of a conventional object-imaging method.
Figure 1B:
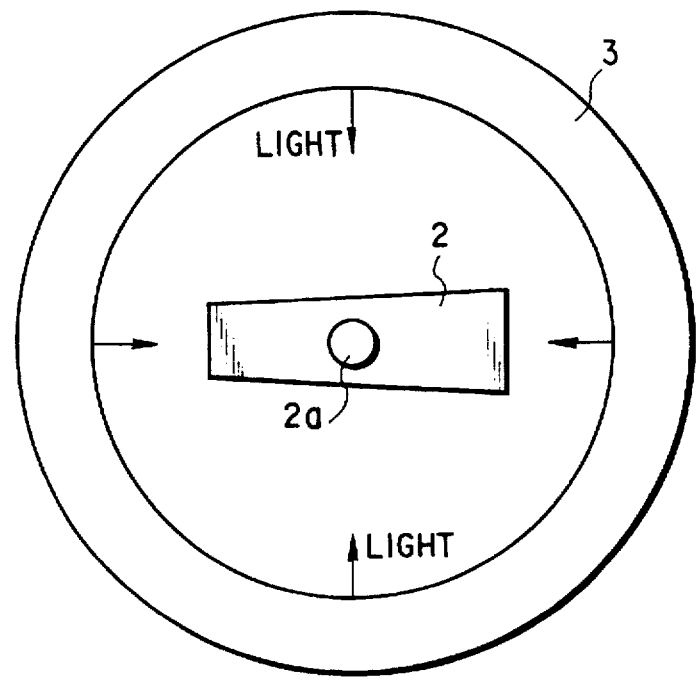

In the enlargement filtering process, as shown in FIG. 1C, if even one white pixel is included in the 8 pixels surrounding the center pixel 5-1, the center pixel 5-1 is whitened. In other words, only when all 8 pixels are black, will the center pixel 5-1 be blackened.

Figure 12:
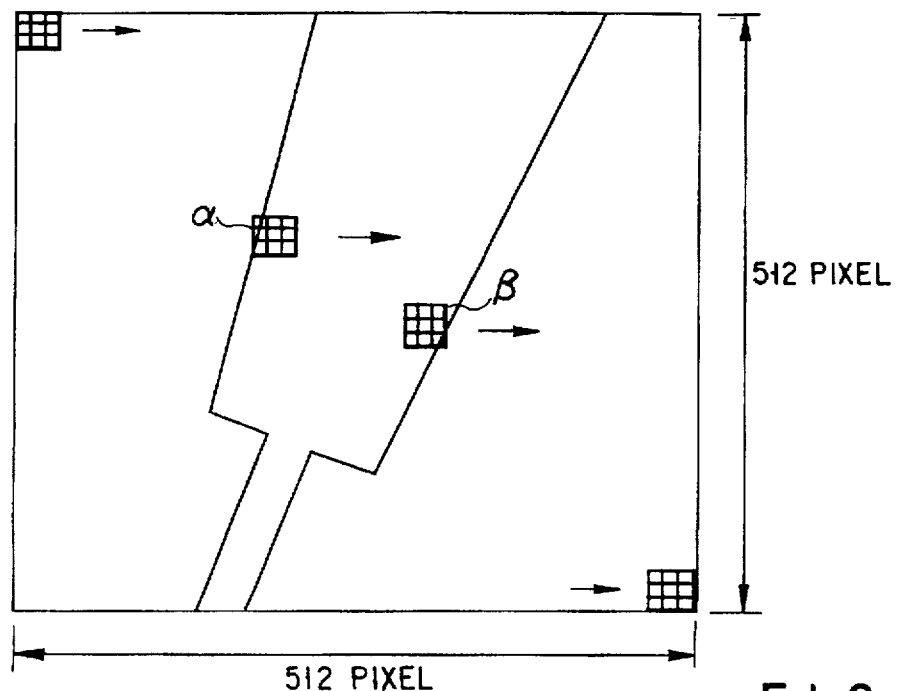
FIG. 12 shows the relationship between a screen and 3×3 pixels scanning the screen.

In the present embodiment, as shown in FIG. 12, the background-illumination image is taken out of the image memory B, and each of the pixels of the screen (512 pixels×512 pixels) is subjected to the enlargement filtering process. For example, at the location of α or β, the center pixel of the 3×3 pixels is black. However, a white pixel is included in the surrounding 8 pixels, and the center pixel is stored in the image memory C as a white pixel (see FIGS. 13A and 13B). As a result, if the enlargement filtering process is executed for the entire screen, a background-illumination image having a smaller black portion than the original background-illumination image is obtained. In general, the 3×3 pixels of one screen are scanned from the upper left one to the lower right one. However, if the entire screen can be scanned, the method of scanning is not limited (the same applies to the following description).

If the enlargement filtering process is executed for the entire screen an X-number of times (e.g. five times), an image, from which a portion of the bonding wire is deleted and in which only a portion of the inner lead is shown in black, can be obtained, as shown in FIG. 10(c) (step ST7).

Then, in order to restore the background-illumination image, from which the contour portion has been deleted, into the original size, the corresponding image is taken out from the image memory C and the reduction filtering process is executed for each of the pixels of the screen (512 pixels×512 pixels) (see FIGS. 13A and 13B). However, since the image portion of the bonding wire has been deleted, this portion will not appear once again. As a result, if the reduction filtering process is executed for the entire screen an X-number of times, an image shown in FIG. 10(d) is produced. That is, the image to be stored in the image memory B has the original size of the background-illumination image, but only the image of the inner lead is present (step ST8).

Subsequently, the downward-illumination image is read out from the image memory A, and the read-out downward-illumination image and the background-illumination image stored in the image memory B are subjected to a NOR process. Specifically, a black portion (0) and a black portion (0) alone become a white portion (1), and the other part becomes a black portion (0). As a result, an image including a white portion corresponding to the bonding wire on the inner lead, as shown in FIG. 10(e), is stored in the image memory C.

Then, the NOR-processed image is read out from the image memory, and the reduction filtering process is executed for each of the pixels of the screen. Then, the reduction filtering process is executed for the entire screen an X-number of times. Thereby, an image including only a white portion corresponding to the wire collapse portion of the bonding wire, as shown in FIG. 10(f), is stored in the image memory B (steps ST10 and ST11).

Subsequently, the image is read out from the image memory B, and the enlargement filtering process is executed for each of the pixels of the screen. Since the image portion of the bonding wire has been deleted, this portion will not appear once again. As a result, if the enlargement filtering process is executed for the entire screen an X-number of times, an image including only a white portion corresponding to the wire collapse portion of the bonding wire of the initial size, as shown in FIG. 10(g), is stored in the image memory C (step ST12).

By the above-described image processing means, the initial object has been achieved. That is, the bonding position of the bonding wire on the inner lead, i.e. the wire collapse portion, can be recognized. For example, as shown in FIG. 10(h), the center of gravity (indicated by x) of the wire collapse portion is measured and thereby the bonding position can be easily recognized.

In addition, according to the present invention, since only the wire collapse portion can be recognized, the area of the collapse portion may be measured to detect the condition of bonding ("good" or "bad").

In the above embodiment, the downward-illumination image and background-illumination image are used as they are. However, these images may be initially inverted, and the inverted images may be used for the above-described processing. In this case, the above-described image processing can be applied basically, but there are three different points:
(1) The order of the enlargement filtering process and the reduction filtering process is reversed.
(2) A NAND process, and not the NOR process, is executed.
(3) The obtained image of the wire collapse portion is black ("white" and "black" are reversed throughout the embodiment).

In the above embodiment, the bonding position of the bonding wire on the inner lead is recognized. However, the present invention is not limited to this. The invention is suitably applicable to the technique of recognizing the bonding position of a bonding wire in the case where the bonding wire is connected to a flat object.

As has been described above, according to the apparatus and method of the present invention for testing the bonding position of the bonding wire, the following advantages can be obtained:

An IC (object) is imaged by using two different imaging techniques, and the obtained images are processed by a predetermined image processing means. Thereby, the bonding position of the bonding wire on the inner lead, i.e. the wire collapse portion, can easily be recognized. Thus, exact measurement by clear image can be performed, test accuracy is enhanced, and the image processing time can be reduced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for determining a bonding position of a bonding wire, comprising:

imaging means, situated above an object, for imaging the object, the object including a member and the bonding wire bonded to the member;

first illumination means, situated above the object, for emitting light to the object;

second illumination means, situated below the object, for emitting light to the object;

image processing means including a memory unit for storing an image obtained by said imaging means and a processing unit for logically processing said image;

first power supply means for supplying power to operate the first illumination means;

second power supply means for supplying power to operate the second illumination means; and control means for controlling the operations of said image processing means, said first power supply means and said second power supply means;

said control means including:

data input means for presetting a number of executions (X: a plural number) of a logical process, each execution comprising a scan of an image pixel-by-pixel, the logical process including an enlargement filtering process and a reduction filtering process;

means for obtaining a first image consisting of an image portion of the member, which image portion has a first brightness, and another image portion having a second brightness, by turning on said first power supply means and imaging the object by means of said imaging means;

means for obtaining a second image consisting of a first image portion of the member and the bonding wire, which first image portion has the second brightness, and a second image portion having the first brightness, by turning on said second power supply means and imaging the object by means of said imaging means;

means for obtaining a third image including a third image portion of the member, the third image portion alone having the second brightness, by subjecting the second image to the enlargement filtering process (X: a plural number) times during which, for each time (X: a plural number), the second image is scanned and a center pixel of each group of 3×3 pixels of the second image is made to have the first brightness if the eight pixels surrounding the center pixel include at least one pixel with the first brightness;

means for obtaining a fourth image by subjecting the third image to the reduction filtering process (X: a plural number) times during which, for each time (X: a plural number), the third image is scanned and the center pixel of each group of 3×3 pixels of the third image is made to have the second brightness if the eight pixels surrounding the center pixel include at least one pixel with the second brightness;

means for obtaining a fifth image including a fifth image portion of the bonding wire on the member, the fifth image portion alone having the first brightness, by combining the first image and the fourth image by one of a NOR process and a NAND process;

means for obtaining a sixth image including a sixth image portion of a part of the bonding wire in contact with the member, the sixth image portion alone having the first brightness, by subjecting the fifth image to the reduction filtering process (X: a plural number) times during which, for each time (X: a plural number), the fifth image is scanned and the center pixel of each group of 3×3 pixels of the fifth image is made to have the second brightness if the eight pixels surrounding the center pixel include at least one pixel with the second brightness;

means for obtaining a seventh image by subjecting the sixth image to the enlargement filtering process (X: a plural number) times during which, for each time (X: a plural number), the sixth image is scanned and the center pixel of each group of 3×3 pixels of the sixth image is made to have the first brightness if the eight pixels surrounding the center pixel include at least one pixel with the first brightness, the seventh image comprising an image of the part of the bonding wire in contact with the member and corresponding to the bonding position of the bonding wire; and means for detecting the bonding position of the bonding wire on the basis of the seventh image by measuring a center of gravity of a wire collapse portion of the bonding wire.

2. The apparatus according to claim 1, wherein each of said images is a two-value image having only two values of white and black, said first brightness is and said second brightness is black, and said first image and said fourth image are converted to the fifth image by the NOR process.

3. The apparatus according to claim 1, wherein each of said images is a two-value image having only two values of white and black, said first brightness is black, said second brightness is white, and said first image and said fourth image are converted to the fifth image by the NAND process.

4. The apparatus according to claim 1, wherein the means for obtaining the third image includes means for changing the brightness of an image of the bonding wire, excluding a portion of the wire situated over the member, from the second brightness to the first brightness when an enlargement filtering process is executed (X: a plural number) times, and the means for obtaining the sixth image includes means for obtaining an image, excluding the image portion of the part of the bonding wire in contact with the member, having the second brightness when a reduction filtering process is executed (X: a plural number) times.

5. An apparatus for determining a bonding position of a bonding wire in which the bonding wire is in contact with a lead, the apparatus comprising:

- means for emitting light to an object from above and detecting the light reflected from the object to obtain a first image on the basis of the detected light, the object comprising the lead and the bonding wire;
- means for emitting light to the object from below and detecting the light passing through an upper portion of the object to obtain a second image on the basis of the detected light;
- means for obtaining a third image by performing on the second image an enlargement filtering process (X: a plural number) times to obtain a first intermediate image, and performing on the first intermediate image a reduction filtering process (X: a plural number) times;
- means for combining the first image and the third image by one of a NOR process and a NAND process to obtain a fourth image;
- means for obtaining a fifth image corresponding to the bonding position of the bonding wire, said fifth image being obtained by performing on the fourth image the reduction filtering process (X: a plural number) times to obtain a second intermediate image, and by performing on the second intermediate image the enlargement filtering process (X: a plural number) times; and
- means for detecting the bonding position of the bonding wire on the basis of the fifth image by measuring a center of gravity of a wire collapse portion of the bonding wire.

6. The apparatus according to claim 5, wherein the first image has a first brightness at an image portion corresponding to the lead and a second brightness at an image portion corresponding to that portion of the bonding wire which is situated over the lead, the second image has the second brightness at image portions corresponding to the lead and the bonding wire, the means for obtaining a third image includes means for establishing an image portion having the second brightness and corresponding to the lead, the means for obtaining a fourth image includes means for establishing an image portion having the first brightness and corresponding to the portion of the bonding wire which is situated over the lead, and the means for obtaining the fifth image includes means for establishing image portions having the first brightness and corresponding to the portion of the lead in contact with the bonding wire.

7. The apparatus according to claim 6, wherein the first brightness is white, the second brightness is black, and the first image and the third image are converted into the fourth image by the NOR process.

8. The apparatus according to claim 6, wherein the first brightness is black, the second brightness is white, and the first image and the third image are converted into the fourth image by the NAND process.

9. The apparatus according to claim 5, wherein the enlargement filtering process is a process in which, within each group of 3×3 pixels included in one of the second image and the fourth image, a center pixel of each of the 3×3 pixels is made to have the first brightness if at least one of the eight pixels surrounding the center pixel has the first brightness, and the reduction filtering process is a process in which, within each group of 3×3 pixels included in one of the second image and the fourth image, a center pixel of each of the 3×3 pixels is made to have the second brightness if at least one of the eight pixels surrounding the center pixel has the second brightness.

* * * * *

UNITED STATES PATENT AND TRADEMARK OFFICE
CERTIFICATE OF CORRECTION

PATENT NO.   :   5,745,594
DATED        :   April 28, 1998
INVENTOR(S)  :   Yuichi MIYAHARA It is certified that error appears in the above-indentified patent and that said Letters Patent is hereby corrected as shown below:

Claim 2, Col. 8, line 48, insert --white-- after "is".

Signed and Sealed this

Twentieth Day of July, 1999

Attest:

Attesting Officer

Q. TODD DICKINSON

Acting Commissioner of Patents and Trademarks